(12) United States Patent
Barich (10) Patent No.: US 9,851,383 B1
(45) Date of Patent: Dec. 26, 2017

(54) METHOD AND SYSTEM FOR PERFORMING VECTOR SPECTRAL MEASUREMENTS OF A RADIO FREQUENCY (RF) SIGNAL HAVING A REPETITIVE WAVEFORM

(71) Applicant: Keysight Technologies, Inc., Minneapolis, MN (US)

(72) Inventor: Edward M. Barich, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 419 days.

(21) Appl. No.: 14/555,141

(22) Filed: Nov. 26, 2014

(51) Int. Cl.
*H04B 17/29* (2015.01)
*G01R 23/02* (2006.01)

(52) U.S. Cl.
CPC .................... *G01R 23/02* (2013.01)

(58) Field of Classification Search
CPC ............... H04B 17/21; H04B 10/5057; H04B 17/0085; H04B 17/101; H04B 17/29; G01D 18/00; G01D 9/005; G01S 13/0209; G01S 13/765; G01S 13/878; G01S 5/14; G01S 7/003
See application file for complete search history.

(56) References Cited

U.S. PATENT DOCUMENTS

| | | | |
|---|---|---|---|
| 3,739,273 A | 6/1973 | Taylor, Jr. | |
| 7,257,497 B2 | 8/2007 | Pickerd | |
| 7,945,407 B2 | 5/2011 | Kenichi et al. | |
| 8,179,118 B2 | 5/2012 | Bernard | |
| 8,831,132 B2* | 9/2014 | Ward ..................... | G01S 5/14 375/130 |
| 2012/0161749 A1* | 6/2012 | Sternberg ............ | H04B 17/101 324/76.23 |
| 2012/0315054 A1* | 12/2012 | Kubo ................. | G03G 15/5058 399/49 |
| 2013/0328504 A1* | 12/2013 | Yavor ................ | H04B 10/5057 315/307 |
| 2016/0028498 A1* | 1/2016 | Verspecht ............ | H03D 7/1441 455/226.1 |

* cited by examiner

*Primary Examiner* — Alesa Allgood (57) ABSTRACT

A method is provided for performing vector spectral measurements of a radio frequency (RF) signal having a repetitive waveform, using a receiver having a frequency span less than a total bandwidth of the RF signal. The method includes capturing multiple frequency segments of the RF signal corresponding to waveforms of the repetitive waveform synchronized to corresponding external triggering, each frequency segment having a corresponding segment bandwidth less than the total bandwidth of the RF signal; performing at least one instance of phase stitching and at least one instance of amplitude stitching between adjacent captured frequency segments; and using an Inverse Fast Fourier Transform (IFFT) to obtain a time-domain record of the repetitive waveform.

19 Claims, 7 Drawing Sheets

METHOD AND SYSTEM FOR PERFORMING VECTOR SPECTRAL MEASUREMENTS OF A RADIO FREQUENCY (RF) SIGNAL HAVING A REPETITIVE WAVEFORM

BACKGROUND

Spectral measurements of wide-bandwidth radio frequency (RF) signals have traditionally been performed using a swept spectrum analyzer, which provides scalar analysis (amplitude only, no phase information) of the signal of interest. To provide for demodulation analysis of complex digitally-modulated RF waveforms, vector (amplitude and phase) spectral measurements must be made on the signal. For example, two common methods of performing vector spectral measurements of RF signals are Digital Oscilloscope (DO) and Wide-Bandwidth Spectrum Analyzer (WBSA).

DO utilizes a high-speed digital oscilloscope to digitize a wide RF spectrum, including the signal of interest. However, DO has limited amplitude resolution (effective digitizer bits), is subject to Nyquist sampling images, and is a relatively expensive instrument. WBSA is a spectrum analyzer with wide intermediate frequency (IF) circuitry, such that a high-speed IF digitizer can be used to measure a wide-bandwidth RF signal. In comparison, a Narrow Bandwidth Spectrum Analyzer (NBSA), for of discussion, is a spectrum analyzer with an IF digitizer bandwidth less than the bandwidth of the signal of interest. The disadvantages of a WBSA include having a bandwidth limited to several hundred megahertz (MHz) and mixing images due to bypassing of its preselector. A WBSA is also a relatively expensive instrument.

In the case of non-repetitive RF waveforms, these two conventional methods are valid methods to obtain vector spectral measurements. However, in the special case of repetitive waveforms, a more accurate and efficient approach is needed.

BRIEF DESCRIPTION OF THE DRAWINGS

The representative embodiments are best understood from the following detailed description when read with the accompanying drawing figures. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As a further example, "substantially removed" means that one skilled in the art would consider the removal to be acceptable.

As used in the specification and the appended claims and in addition to its ordinary meaning, the term "approximately" or "about" means to within an acceptable limit or amount to one having ordinary skill in the art. For example, "approximately the same" means that one of ordinary skill in the art would consider the items being compared to be the same.

Generally, according to various embodiments, a method is provided for performing vector spectral measurements of a radio frequency (RF) signal having a repetitive waveform, using a spectrum analyzer having a frequency span less than a total bandwidth of the RF signal. The method includes capturing multiple frequency segments of the RF signal corresponding to waveforms of the repetitive waveform synchronized to corresponding external triggering, each frequency segment having a corresponding segment bandwidth less than the total bandwidth of the RF signal; and performing at least one instance of phase stitching and at least one instance of amplitude stitching between adjacent captured frequency segments using the external triggering to obtain a stitched signal having the repetitive waveform. The external triggering is responsive to a marker signal which occurs in repetitions of the repetitive waveform.

Also, according to various embodiments, a narrow bandwidth spectrum analyzer (NBSA) is used to make vector spectral measurements of wide-bandwidth RF signals having repetitive waveforms using a "frequency stitching" or "frequency concatenating" technique. The maximum bandwidth that can be measured therefore is limited by the RF frequency range of the NBSA, and not the relatively narrow bandwidth. Consequently, vector analysis of repetitive waveform, wide-bandwidth RF signals may be performed using an NBSA, which is generally less expensive and more commonly available than a DO or a WBSA, for example. In addition, various embodiments allow for the use of RF preselection in the NBSA, which decreases signal interference caused by sampling and mixing images that are common in DO and un-preselected WBSA instruments. Generally, in the various embodiments, the frequency stitching technique for repetitive waveforms includes "marker signals" or "reference signals" accompanying the waveforms, respectively, which are used as external triggers for a receiver, which are used to preserve phase continuity or reference between each of the stitched frequency bands. Embodiments of the frequency stitching technique may be applicable to error-vector-magnitude (EVM) measurements of a device under test (DUT), such as a power amplifier, as well as to other signal-quality measurements.

The general concept of joining multiple scalar spectral measurements into a larger composite frequency scan is known. For instance, a method called "time domain scanning" has been used in electromagnetic interference (EMI) measurement receivers, such as spectrum analyzers, to combine narrow-bandwidth fast Fourier transform (FFT) measurements of small frequency segments (or spectral segments) into wider frequency scans. To apply this stepped-frequency/concatenated spans method to vector analysis, the phase relationships between individual frequency segments need to be accurately maintained. However, the phase of the spectrum analyzer's local oscillator (LO) varies from one center frequency to another and generally cannot be predicted.

Figure 1:
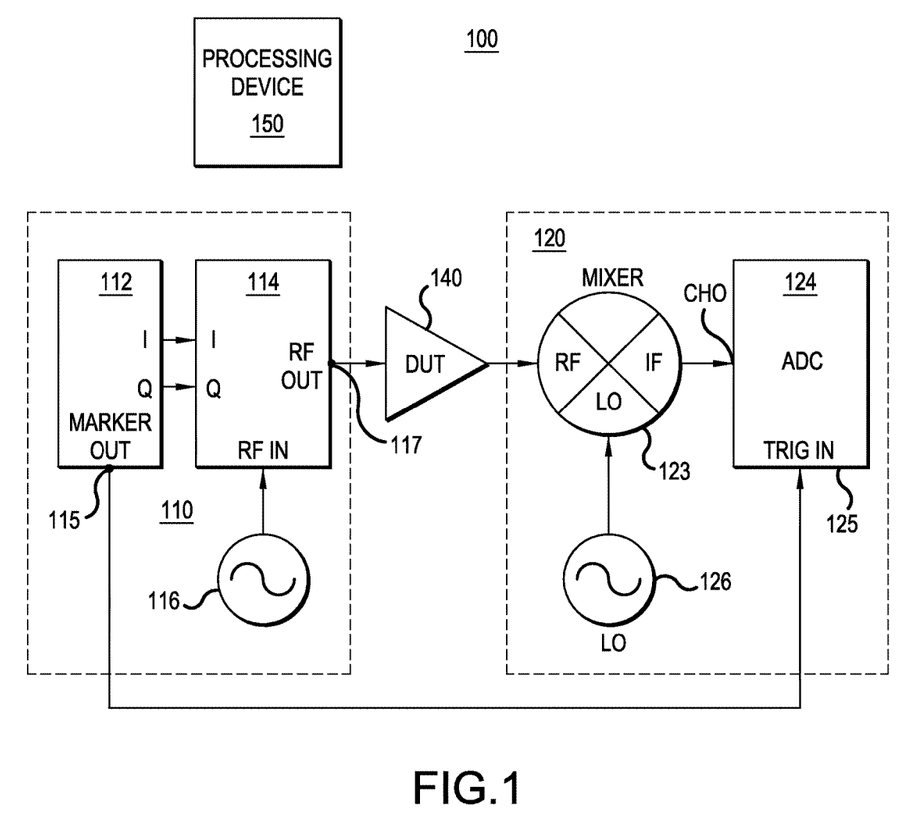
FIG. 1 is a simplified block diagram of a system for performing vector spectral measurements of a radio frequency (RF) signal having a repetitive waveform, including a spectrum analyzer having a frequency span less than a total bandwidth of the RF signal, according to a representative embodiment.

FIG. 1 is a simplified block diagram of a system for performing vector spectral measurements of a radio frequency (RF) signal having a repetitive waveform, according to a representative embodiment.

Referring to FIG. 1, vector spectral measuring system 100 includes an RF signal generating device 110 and a receiver 120. The RF signal generating device 110 is configured to generate an RF signal which may be used as a stimulus signal for exciting device under test (DUT) 140. The receiver 120 is configured to receive and measure an output RF signal provided by the DUT 140 in response to the stimulus signal. The receiver 120 has a frequency span that is less than a total bandwidth of the RF signal generated by the RF signal generating device 110 and the DUT 140. The receiver 120 may be included in a spectrum analyzer or a vector network analyzer. For example, in various embodiments, the vector spectral measuring system 100 may be an N523xA PNA-L Series or N524xA PNA-X Series VNA, available from Keysight Technologies, Inc., although other types of measuring devices (or measuring systems) may be incorporated without departing from the scope of the present teachings. The DUT 140 may be a power amplifier, for example, although the DUT 140 may be other type of device that outputs a wideband RF signal.

In the depicted embodiment, the RF signal generating device 110 includes a signal generator 112 and an RF up-converter 114. The signal generator 112 may be an arbitrary wave generator (AWG), for example, having in-phase (I) and quadrature (Q) outputs. More particularly, the signal generator 112 may be configured to generate an IQ modulated input signal having a having a repetitive waveform, and a total bandwidth greater than the frequency span of the receiver 120, as mentioned above. The RF up-converter 114, which may be an IQ-modulator, is configured to up-convert the modulated input signal received from the signal generator 112 to an RF signal (with the repetitive waveform), using RF oscillator 116. The RF oscillator 116 may be adjustable to accommodate a variety of frequencies for the RF signal.

The signal generator 112 is further configured to generate a marker signal. The marker signal may occur in every waveform repetition of the RF signal, although the frequency of occurrence may vary to provide unique benefits for any particular situation or to meet application specific design requirements of various implementations, as would be apparent to one skilled in the art. That is, the marker signal may occur in every Nth repetition of the repetitive waveform, where N is an integer. Generally, the smaller the value of N, the more quickly and/or efficiently the vector spectral measurements are performed. At a minimum, enough marker signals need to occur to ensure that all the frequency segments of the RF signal are captured. Stated broadly, a marker signal generated by the signal generator 112 occurs in at least one repetition of the repetitive waveform. Regardless of the number of waveform repetitions in which the marker signals occur, the marker signals occur (e.g., provide a rising or falling edge) at substantially the same relative time point in the waveform repetitions. For example, each of the marker signals may be a transistor-transistor logic (TTL) pulse with a rising or falling edge occurring at substantially the same relative time point in each waveform repetition in which the marker signal occurs.

The signal generator 112 outputs marker signals from a marker-out port 115 to act as an external trigger for the receiver 120, as discussed below. For example, when the receiver 120 is commanded (e.g., manually or remotely under processing unit 150, discussed below) to make a measurement, it will start on the next marker signal it encounters, and record data up to the required time length (which will be greater than or equal to one waveform repetition). Once this data has been recorded, the receiver 120 will step up its center frequency for the next frequency segment capture, and will wait until the next marker signal to start recording, and so on.

In an alternative embodiment, when the RF signal is pulsed (bursted) RF signal, a specific marker signal need not be generated for triggering the receiver 120. Rather, a broadband RF detector (not shown) may be used for detecting the start times of the RF bursts, for example. The output of the RF detector thus marks a unique time (e.g., the RF burst start time) in the period of each repetitive waveform, and therefore can act as the external trigger for the receiver 120, as discussed below.

The DUT 140 receives the RF signal from the RF signal generating device 110 via an RF-out port 117 as a stimulus signal, and provides an output RF signal in response to the stimulus signal, where the output RF signal has essentially the same total bandwidth and the same repetitive waveform as the RF signal provided by the RF up-converter 114. As mentioned above, the frequency span of the receiver 120 is less than the total bandwidth of the RF signal output by the DUT 140. Therefore, the entire spectrum of the RF signal cannot be received and measured directly by the receiver 120.

The receiver 120 includes an analog-to-digital converter (ADC) 124 with a trigger-in port 125 for triggering sampling operation of the ADC 124. In the depicted embodiment, the ADC 124 (and thus the receiver 120) is externally triggered by the marker signal(s) generated by the signal generator 112 in at least one waveform repetition, as discussed above. For example, the external triggering is responsive to the marker signals which occurs in repetitions of the repetitive waveform and corresponding to the frequency segments. Notably, the receiver 120 may utilize interpolation to achieve sub-sample time resolution for externally-triggered waveform recordings, which may be needed to achieve optimum phase accuracy. The receiver 120 further includes representative mixer 123, and a local oscillator (LO) 126 configured to generate different LO signals having different LO frequencies, as discussed below. The ADC 124 may have multiple channels, indicated by representative channel CHO, for receiving the output (IF signal) of the mixer 123. A band-limiting filter (not shown) may be placed between the IF output of the mixer 123 and the input of the ADC, e.g., to prevent image responses from being measured.

The IF bandwidth (or, frequency span) of the receiver 120 is much less than the total bandwidth of the output RF signal provided by the DUT 140. The receiver 120 therefore is unable to receive and/or measure the entire output RF signal at the same time, and therefore is configured to receive frequency segments of the output RF signal (via the mixer 123) using the different LO signal frequencies from the LO 126 corresponding to narrow band frequency segments of the total bandwidth of the RF signal. That is, the different frequency segments are measured as the receiver 120 is stepped across the wider frequency range of the total bandwidth using different LO frequencies. The marker signals provide external triggering of the ADC 124 for preserving phase continuity among the frequency segments of the output RF signal.

The IF signals corresponding to the different LO frequencies collectively form ADC data records, respectively. Each ADC data record corresponds to a frequency segment, including the marker signal used for the external triggering. The set of different LO frequencies generated by the LO 126 is chosen to make it possible to scan the full spectrum of the output RF signal from the DUT 140 using the limited frequency span of the receiver 120. That is, the number of different LO frequencies of the LO signals is selected to provide enough ADC data records corresponding to frequency segments to capture the full spectrum of he total bandwidth of the output RF signal.

Thus, for vector spectral measurements according to various embodiments, the RF signal generated by the RF signal generating device 110 has at least the following attributes: (i) a waveform repetitive in time, i.e., a finite period, and (ii) a separate marker signal that occurs at the same relative time point in one or more waveform repetitions. When the marker signal is used to externally trigger the ADC 124, each spectral measurement will have a known time relationship with respect to the waveform, regardless of the LO phase of the receiver 120, enabling stable spectral measurements of phase over time.

In various embodiments, the vector spectral measuring system 100 may further include a processing unit 150 configured to control operations of the vector spectral measuring system 100. The processing unit 150 may be included in the vector spectral measuring system 100 or may be a separate device, such as a personal computer (PC). The processing unit 150 is connected to one or more of the components of the vector spectral measuring system 100, such as the RF signal generating device 110 and the receiver 120, for controlling various aspects of stitching the frequency segments for measuring signals output by the DUT 140, including execution of various steps depicted in FIGS. 2 and 3, discussed below. Although no specific connections to the processing unit 150 are shown in FIG. 1 for the sake of convenience, it is understood that any type of wired and/or wireless connections between the processing unit 150 and components of the vector spectral measuring system 100, enabling transmission of communication and control signals, may be incorporated without departing from the scope of the present teachings.

Generally, the processing unit 150 may be implemented by a computer processor (e.g., of a PC or dedicated workstation), application specific integrated circuits (ASICs), field-programmable gate arrays (FPGAs), or combinations thereof, using software, firmware, hard-wired logic circuits, or combinations thereof. A computer processor, in particular, may be constructed of any combination of hardware, firmware or software architectures, and may include memory (e.g., volatile and/or nonvolatile memory) for storing executable software/firmware executable code that allows it to perform the various functions. In an embodiment, the computer processor may comprise a central processing unit (CPU), for example, executing an operating system. The processing unit 150 may include a storage device, such as random access memory (RAM), read-only memory (ROM), flash memory, electrically programmable ROM (EPROM), electrically erasable programmable ROM (EEPROM), hard disk drive (HDD), or the like. Data from various measurements and characterizations of the DUT 180 may be displayed and/or stored for analysis, for example. A user interface, such as a graphical user interface (GUI) may be included with the processing unit 150 for a user to control operations and/or view data and computation results of the measuring device 100.

Figure 2:
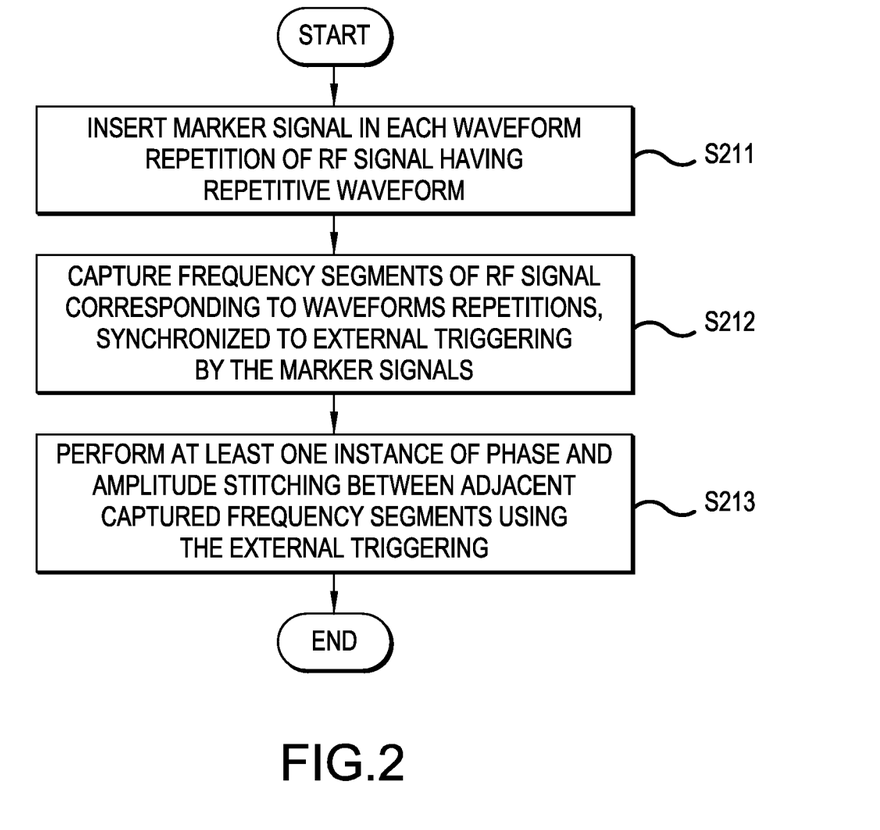
FIG. 2 is a flow diagram of a method of performing vector spectral measurements of an RF signal having a repetitive waveform, using a spectrum analyzer having a frequency span less than a total bandwidth of the RF signal, according to a representative embodiment.

FIG. 2 is a flow diagram of a method of performing vector spectral measurements of an RF signal having a repetitive waveform, using a spectrum analyzer (e.g., an NBSA) having a frequency span less than a total bandwidth of the RF signal, according to a representative embodiment. The method of FIG. 2 may be performed by the vector spectral measuring system 100 of FIG. 1, for example, and may be referred to as a panoramic vector spectral measurement or a panoramic vector frequency scan.

Referring to FIG. 2, a marker signal occurs in each repetition of the repetitive waveform of the RF signal in block S211, although in alternative embodiments, marker signals may occur in fewer than all (at least one) of the waveform repetitions, as discussed above. The marker signal may be a TTL pulse generated by the signal generator, which also generates the wideband RF signal having the repetitive waveform. The marker signal occurs at substantially the same relative time point in the corresponding repetition of the repetitive waveform.

In block S212, multiple frequency segments of the RF signal are captured, where the frequency segments correspond to waveform repetitions of the repetitive waveform, respectively. The captured frequency segments are synchronized to external triggering of the spectrum analyzer by the corresponding marker signals which occur in repetitions of the repetitive waveform of the RF signal. That is, the marker signals are routed to a trigger input of the spectrum analyzer, which is configured for external triggering. Each frequency segment has a corresponding segment bandwidth less than the total bandwidth of the RF signal (and less than the frequency span of the spectrum analyzer). In an embodiment, the RF signal may be the output of a DUT in response to a stimulus signal, for example.

In block S213, at least one instance of phase stitching (or concatenating) and at least one instance of amplitude stitching (or concatenating) is performed between adjacent captured frequency segments of the RF signal using the external triggering to obtain a stitched signal having the repetitive waveform. For example, where there are more than two captured frequency segments, the method will include multiple instances of phase and amplitude stitching. The frequency segments may be stitched into a combined bandwidth substantially the same as the total bandwidth of the RF signal in response to the external triggering, e.g., for preserving phase continuity between the frequency segments. That is, the stitched (concatenated) frequency segments have no phase discontinuities at the frequency stitch points.

Performing the at least one instance of phase stitching may include performing at least one instance of phase offset correction. That is, the LO frequency of the spectrum analyzer randomly varies from a center frequency of one frequency segment to a center frequency of another frequency segment of the multiple frequency segments, as discussed further below, requiring phase offset correction. The phase offset correction may be performed, for example, by selecting an optimum stitch frequency at a stitch point, where the optimum stitch frequency includes a frequency at which there is significant spectral power relative to the spectral powers of other frequencies in the frequency segment. The phase offset correction then further includes calculating the phase offset at the optimum stitch frequency, and correcting phase of all points in the corresponding frequency segment by the calculated offset value, resulting in a continuous phase at the stitch point. Performing the at least one instance of amplitude stitching may include performing at least one instance of weighted averaging of the amplitude measurements of the adjacent segments of the multiple frequency segments, where the adjacent segments are overlapping.

Figure 3:
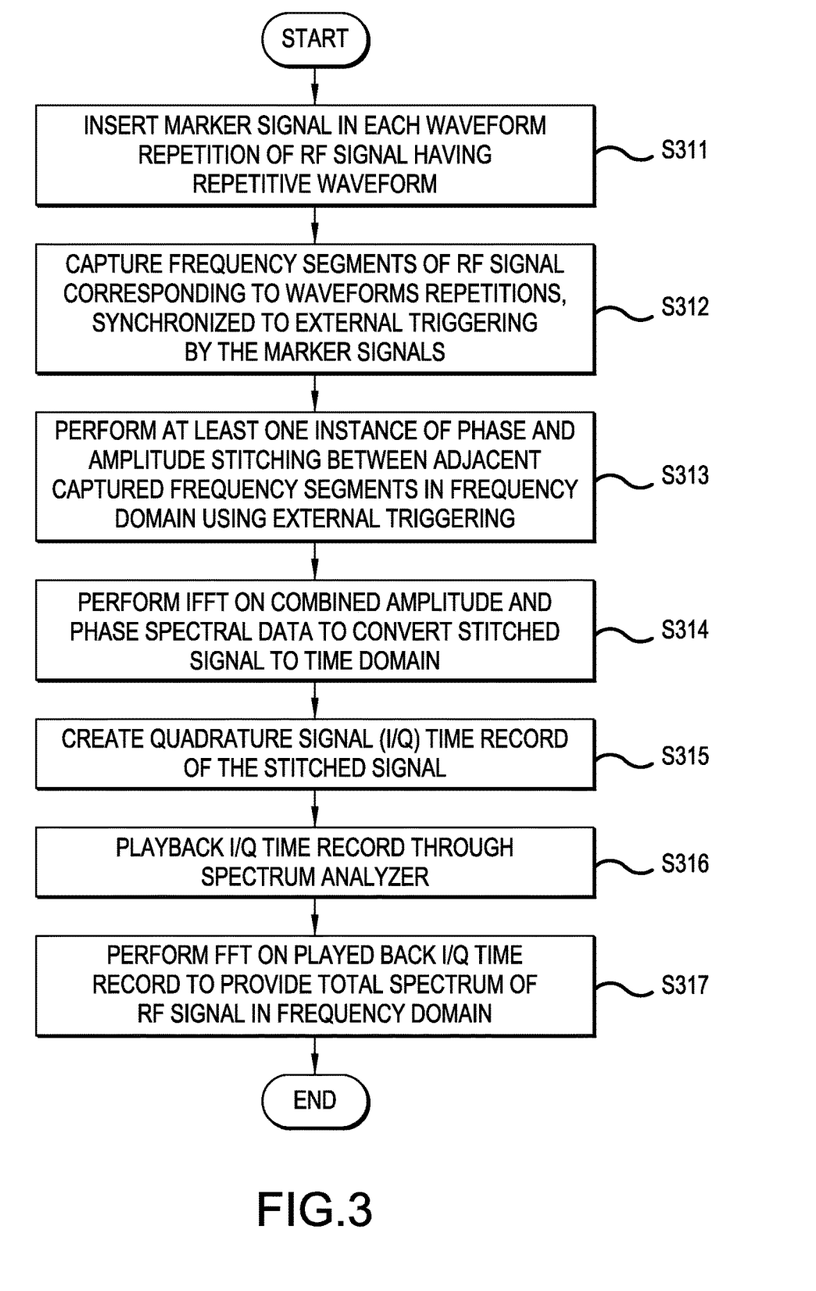
FIG. 3 is a flow diagram of a method of performing vector spectral measurements of an RF signal having a repetitive waveform, using a spectrum analyzer having a frequency span less than a total bandwidth of the RF signal, according to another representative embodiment.

FIG. 3 is a flow diagram of a method of performing vector spectral measurements of an RF signal having a repetitive waveform, using a spectrum analyzer (e.g., an NBSA) having a frequency span less than a total bandwidth of the RF signal, according to another representative embodiment. The method of FIG. 3 may be performed by the vector spectral measuring system 100 of FIG. 1, for example, and may be referred to as a panoramic vector spectral measurement or a panoramic vector frequency scan.

Referring to FIG. 3, a marker signal occurs in each repetition of the repetitive waveform of the RF signal in block S311, although in alternative embodiments, marker signals may occur in fewer than all (at least one) of the waveform repetitions, as discussed above. In block S312, multiple frequency segments of the RF signal are captured, specifically in the frequency domain, where the frequency segments correspond to waveform repetitions of the repetitive waveform, respectively. The captured frequency segments are synchronized to external triggering of the spectrum analyzer by the corresponding marker signals which occur in repetitions of the repetitive waveform of the RF signal, as discussed above. In block S313, at least one instance of phase and amplitude stitching (or concatenating) is performed, specifically in the frequency domain, between adjacent captured frequency segments of the RF signal. The frequency segments may be stitched into a combined bandwidth substantially the same as the total bandwidth of the RF signal in response to the external triggering, e.g., for preserving phase continuity between the frequency segments.

In block S314, an inverse fast Fourier transform (IFFT) is performed on combined amplitude and phase spectral data to convert the frequency domain stitched signal to the time domain. A quadrature signal (I/Q) time record of the stitched signal is then created in block S315, and the I/Q time record is played back through the spectrum analyzer in block S316. The I/Q time record corresponds to the total bandwidth of the RF signal in the time domain. In block S317, an FFT is performed on the played back I/Q time record to provide a total spectrum of the RF signal in the frequency domain. Once in the frequency domain, amplitude and phase vs. frequency displays of the total spectrum, for example, may be displayed. Also, other signal analysis processes, such as demodulation of the signal, may be performed on the resulting I/Q time record. The IFFT and the FFT processes, and creating the I/Q time records, may be performed by a processor, such as the processing unit 150, for example.

As an example of a measurement of an RF signal with a repetitive waveform, a multi-tone RF signal was generated using a signal generator (e.g., an N5182A Signal Generator, available from Keysight Technologies, Inc). The RF signal had 51 equal-amplitude tones, each separated by 200 KHz. The center frequency of the RF signal was 1 GHz, the total bandwidth was 10 MHz, and each tone was generated to have the same phase. The RF signal was routed to an RF input of a signal analyzer (e.g., an N9020A Signal Analyzer, available from Keysight Technologies, Inc.). A marker signal output from the signal generator was routed to the trigger input of the signal analyzer, which was configured for external triggering. Vector signal analyzer (VSA) software (e.g., Keysight 89600B Vector Signal Analyzer software, available from Keysight Technologies, Inc.) was used to provide spectral analysis of digitized waveforms.

Figure 4:
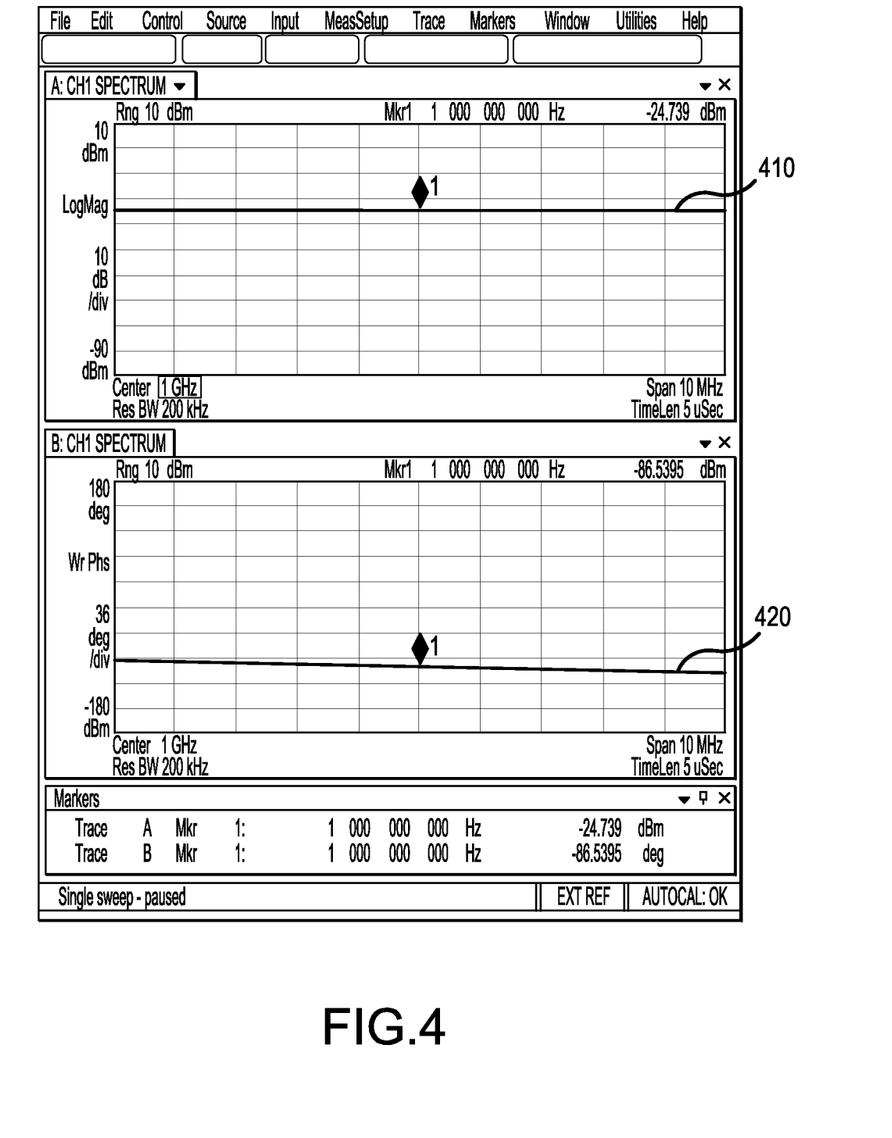
FIG. 4 provides a vector signal analyzer (VSA) display showing signal amplitude vs. frequency in amplitude and phase traces, according to a representative embodiment.

FIG. 4 provides a VSA display showing signal amplitude vs. frequency in the amplitude (upper) trace 410, and the signal phase vs. frequency in the phase (lower) trace 420. The number of FFT points is set to 51, so that each frequency point on the display represents a single tone of the multi-tone RF signal. Since each tone of the signal was generated to have equal amplitude and phase, both the amplitude and phase traces 410 and 420 are substantially constant across the 10 MHz span of the signal.

Figure 5A:
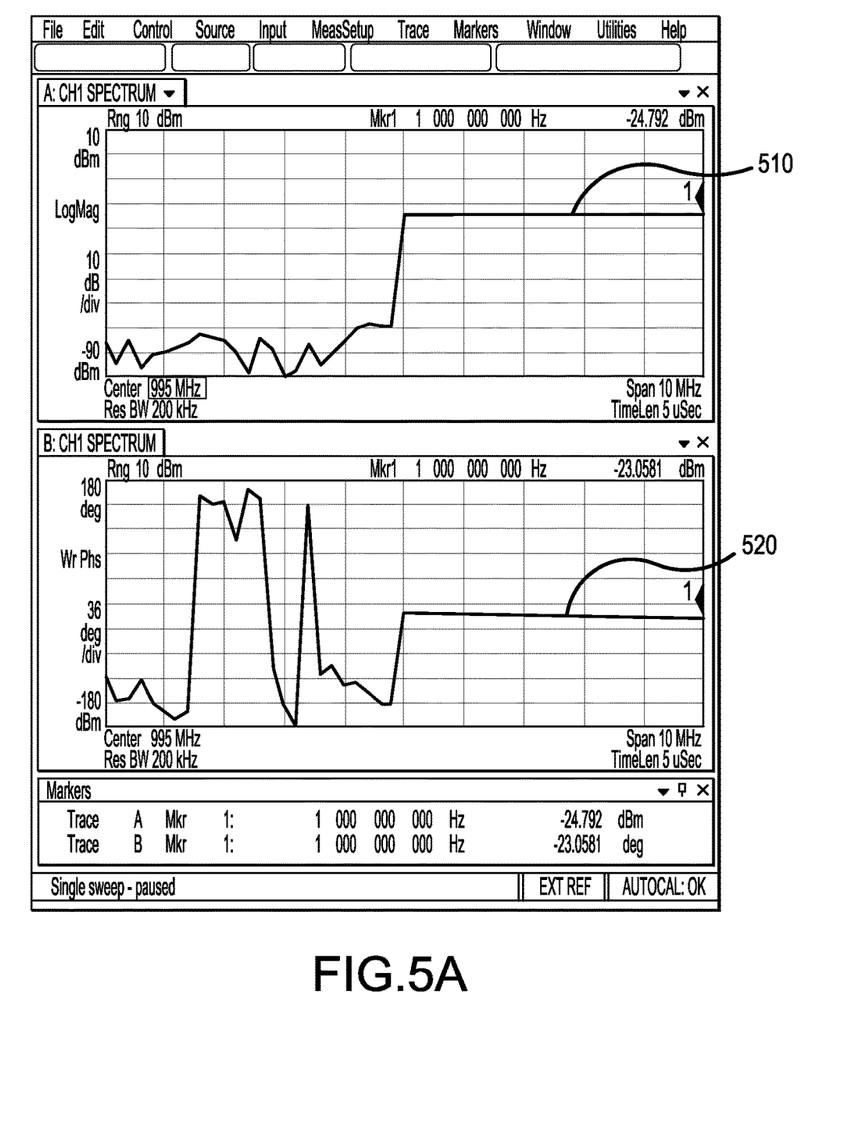
FIGS. 5A and 5B provide displays of illustrative frequency-stepped spectral scans of an RF signal.
Figure 5B:
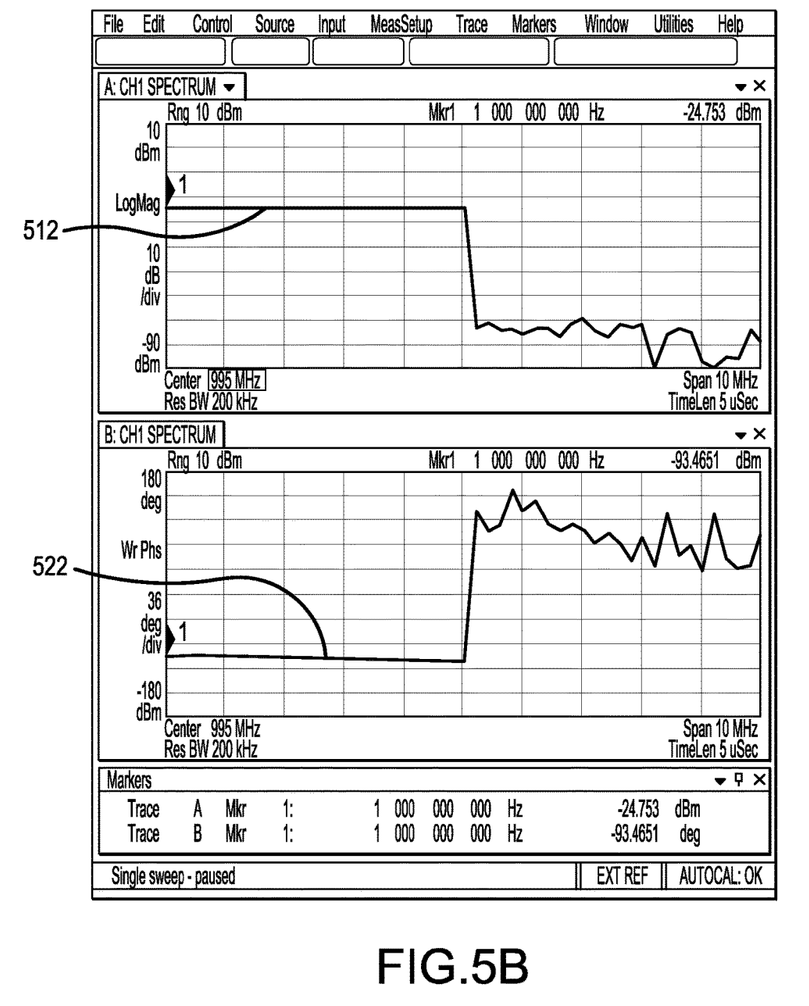

FIGS. 5A and 5B provide illustrative displays of frequency-stepped spectral scans of an RF signal, respectively. In FIG. 5A, the center frequency of the spectrum analyzer is set to 995 MHz, for example, which is 5 MHz below the center frequency (1 GHz) of the multi-tone RF signal. The left side of each of the amplitude (upper) trace 510 and the phase (lower) trace 520 in FIG. 5A is noise since there are no tones present, and the right side of each of the amplitude trace 510 and the phase trace 520 in FIG. 5A shows the amplitude and phase, respectively, of the lower 5 MHz frequency segment of the 10 MHz total bandwidth of the RF signal. Notably, the 1 GHz marker on the phase trace 520 in FIG. 5A shows −23.0581 degrees, while the same marker on the phase trace 420 in FIG. 4 shows −86.5395 degrees, thus indicating a random phase offset of the spectrum analyzer's LO between the two center frequency settings. Although the phase trace 520 is offset, it is important to note that the general shapes of the phase trace 520 and the phase trace 420 in the lower 5 MHz region are substantially the same for both measurements.

Figure 6:
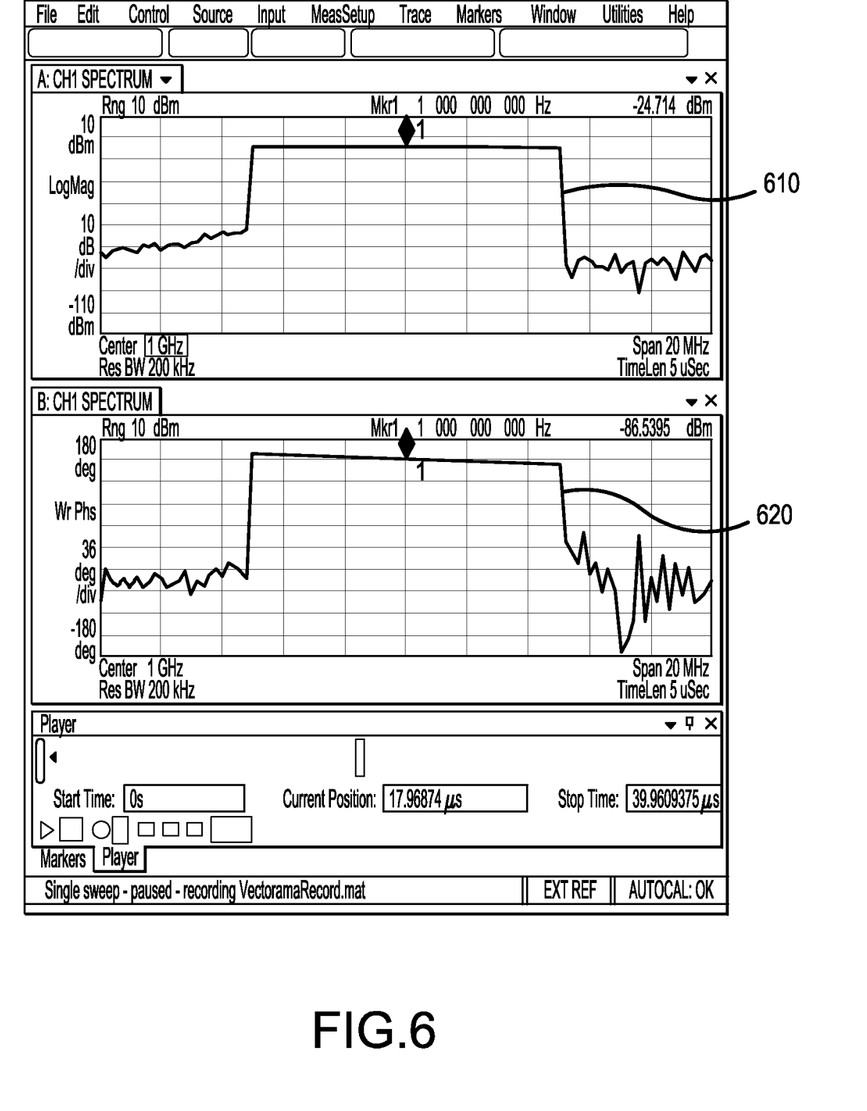
FIG. 6 provides a display showing an I/Q time recording of a multi-tone RF signal, consisting of multiple spectral measurements stitched together, according to a representative embodiment.

In FIG. 5B, the center frequency of the spectrum analyzer is set to 1005 MHz, for example, which is 5 MHz above the center frequency (1 GHz) of the multi-tone RF signal. Similarly, the right side of each of the amplitude (upper) trace 512 and the phase (lower) trace 522 in FIG. 5B is noise since there are no tones present, and the left side of each of the amplitude trace 512 and the phase trace 522 in FIG. 5B shows the amplitude and phase, respectively, of the upper 5 MHz frequency segment of the 10 MHz total bandwidth of the RF signal. The 1 GHz marker on the phase trace 522 in FIG. 5B shows −93.4651 degrees, while the same marker on the phase trace 420 in FIG. 4 shows −86.5395 degrees, again indicating the random phase offset. However, the general shapes of the phase trace 522 and the phase trace 420 in the upper 5 MHz region are substantially the same for both measurements. Therefore, by using external triggering from the waveform marker, the spectral phase trace maintains its shape independent of the spectrum analyzer's center frequency, although a random phase offset is inserted at each measurement center frequency.

Where two spectral measurements have frequency overlap, the random phase offset can be eliminated. For instance, in FIGS. 5A and 5B, the difference between the phase readings at the 1 GHz marker is −23.0581-(−93.4651)= 70.4070 degrees. If 70.4070 degrees is added to each phase point of the phase trace 522 in FIG. 5B, the 1 GHz point would line up exactly with the same point of the phase trace 520 in FIG. 5A. As a result, the two phase traces 520 and 522 can be stitched together to create a wider 20 MHz span phase trace (from the concatenated 10 MHz spans), as shown in FIG. 6, for example. The amplitude traces 510 and 512 in FIGS. 5A and 5B, respectively, can also be stitched together, although no amplitude offset need be applied in this simplified example, in which there is only a one point overlap between FIGS. 5A and 5B. In other examples, the spectral overlap is greater (e.g., up to 50 spectral overlap, as discussed below), potentially requiring amplitude averaging of the two sets of overlapping amplitude measurements. The combined amplitude and phase spectral data can then be inverse-transformed back into the time domain, as discussed above with reference to block S314 in FIG. 3, creating an I/Q time record that can be played back through the VSA software, as discussed above with reference to blocks S315 and S316 in FIG. 3.

FIG. 6 shows a display of an example of an I/Q time recording of the above multi-tone RF signal, consisting of three 6.67 MHz spectral measurements stitched together, according to a representative embodiment, to provide a 20 MHz wide panoramic vector frequency scan. The resulting time record played back through the VSA software shows the entire multi-tone spectra in a 20 MHz span, including amplitude trace 610 and phase trace 620. Thus, wide spectral displays of RF signal amplitude and phase can be created from smaller frequency span measurements of repetitive signals.

The method of stitching together or concatenating spectral phase measurements works most accurately when there is a large signal to noise ratio at the stitch frequency. The method of stitching at the common edge frequency of two adjacent spectral measurements may not work in general, due to possible lack of signal power at that edge frequency. To avoid this problem, spectral measurements may be performed with frequency overlap, such as fifty percent frequency overlap, for example, although smaller (or larger) overlap percentages may be used, without departing from the scope of the present teachings. By choosing the maximum amplitude frequency point in the overlap region between two adjacent measurement frequency scans as the stitch frequency, phase accuracy is maintained when the frequency segments are concatenated.

The panoramic vector frequency scan described herein is capable of measuring complex signals with bandwidths much greater than the maximum ADC frequency span of the spectrum analyzer. For wide-bandwidth measurements in the microwave frequency range, spectrum analyzers are typically set to a preselector bypass mode to reduce amplitude errors caused by the YIG filter in the RF input. However, as signal bandwidths approach twice the first IF frequency (e.g., 300 MHz in Keysight X-series analyzers), the lack of preselection can cause interference created by signal power at the IF image frequency. To avoid the interference problem caused by IF images, the panoramic vector frequency scan can be performed with the preselector not bypassed, using measurement frequency spans less than the preselector bandwidth. An advantage of this method is that the RF preselection will reduce the total signal power entering the receiver, allowing for higher dynamic range measurements of the frequency segments.

At a high level, an algorithm for performing panoramic vector frequency scans may be as follows, e.g., executable by a processor, such as the processing device 150 in FIG. 1. Input parameters include "Center_Frequency" (which is the RF signal center frequency (in Hz)), "Meas_Span" (which is the RF signal spectral bandwidth (in Hz)), and "Meas_Time_Length" (which is the desired output time record length (in seconds)).

Measurement parameters may be calculated by initially choosing "VSA_Span" to be equal to the maximum ADC frequency span of the spectrum analyzer. The maximum frequency span may be limited by preselector bandwidth, for example, as mentioned above. An integer number N of frequency spans may be calculated as N=ceil(Meas_Span/VSA_Span), and then VSA_Span may be recalculated as VSA_Span=Meas_Span/N. The number of time points in each VSA_Span may be calculated as Time_Points= 1.28*VSA_Span*Meas_Time_Length. Since there is an additional scan per 50 percent frequency overlap region, the number M of measurement scans that will be made is M=(2*N)−1.

The VSA may be set to vector spectral measurement mode, showing amplitude vs. frequency in a first display and phase vs. frequency in a second display. The measurement frequency span is set to VSA_Span. With windowing set to Uniform, for example, the number of frequency display points is set to Time_Points/1.28. The measurement center frequency is initially set to Center_Frequency and the analyzer is auto-ranged for optimum dynamic range. M frequency spans may then be measured over the Meas_Span with 50 percent frequency overlap, according to the following measurement loop:

For I=1 to M
Set VSA center frequency=Center Frequency+VSA_Span*(I−N)/2;
Take VSA measurement;
Record Span_Amplitude array;
Record Span_Phase array;
Next I The measured frequency span amplitude and phase arrays may be concatenated in each frequency scan overlap region, according to the following concatenation loop:

For I=1 to N−1
Find maximum amplitude point F in the overlap region between adjacent frequency scans;
At point F, calculate the Phase_Offset between lower and upper frequency scans;
Subtract the Phase_Offset from each phase point in the upper frequency scan;
Concatenate the lower frequency scan phase points below point F with the upper frequency scan points at point F and above; and Calculate the amplitude points in the frequency overlap region as the weighted average of the measured amplitude values;
Next I In order to generate the time record, the concatenated frequency domain points are converted into a time domain record, as follows:

Combine concatenated amplitude and phase vectors into a complex I/Q vector vs. frequency;
Perform inverse FFT to generate I/Q vs. time array;
Save waveform time record to file:
Input Center=Center_Frequency;
Freq Max=Center_Frequency+Meas_Span/2;
Freq Min=Center_Frequency −Meas_Span/2;
Time per point=1/(1.28*Meas_Span);
Time_Data=I/Q vs. time array;
Program End One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

What is claimed is:

1. A method of performing vector spectral measurements of a radio frequency (RF) signal having a repetitive waveform, using a receiver having a frequency span less than a total bandwidth of the RF signal, the method comprising:
 capturing a plurality of frequency segments of the RF signal corresponding to waveforms of the repetitive waveform synchronized to corresponding external triggering, each frequency segment having a corresponding segment bandwidth less than the total bandwidth of the RF signal; and
 performing at least one instance of phase stitching and at least one instance of amplitude stitching between adjacent captured frequency segments using the external triggering to obtain a stitched signal having the repetitive waveform,
 wherein the external triggering is responsive to a marker signal which occurs in at least one repetition of the repetitive waveform and corresponding to the plurality of frequency segments.

2. The method of claim 1, wherein performing the at least one instance of amplitude stitching comprises performing a weighted averaging of amplitude measurements of adjacent segments of the plurality of frequency segments, where the adjacent segments are overlapping.

3. The method of claim 1, wherein performing the at least one instance of phase stitching comprises performing at least one instance of phase offset correction.

4. The method of claim 3, wherein performing the at least one instance of phase offset correction comprises:
 selecting an optimum stitch frequency at a stitch point for each frequency segment, wherein the optimum stitch frequency is a frequency at which spectral power is maximum relative to spectral powers of other frequencies in the frequency segment;
 calculating phase offset at the optimum stitch frequency; and
 correcting phase of all points in the corresponding frequency segment by the calculated offset value, resulting in a continuous phase at the stitch point.

5. The method of claim 3, wherein a local oscillator (LO) frequency of the receiver randomly varies from a center frequency of one frequency segment to a center frequency of another frequency segment, requiring the at least one instance of phase offset correction.

6. The method of claim 1, wherein the plurality of frequency segments are captured and stitched in frequency domain.

7. The method of claim 6, further comprising:
 performing an inverse fast Fourier transform (IFFT) on combined amplitude and phase spectral data to convert the frequency domain stitched signal to time domain; and
 creating a quadrature signal (I/Q) time record of the stitched signal.

8. The method of claim 7, further comprising:
 playing back the I/Q time record through the receiver, the I/Q time record corresponding to the total bandwidth of the RF signal in the time domain.

9. The method of claim 8, further comprising:
 performing demodulation of the RF signal on the FQ time record.

10. The method of claim 8, further comprising:
 performing an FFT on the played back I/Q time record to provide a total spectrum of the RF signal in the frequency domain.

11. The method of claim 10, further comprising:
 providing amplitude vs. frequency and phase vs. frequency displays of the total spectrum.

12. The method of claim 1, further comprising:
 routing the marker signal which occurs in at least one repetition of the repetitive waveform to a trigger input of the receiver, which is configured for external triggering.

13. The method of claim 12, wherein the marker signal occurs at substantially the same time point in each repetition of the repetitive waveform in which it occurs.

14. The method of claim 12, wherein the marker signal comprises a transistor-transistor logic (TTL) pulse with rising or falling edge occurring at substantially the same relative time point in each repetition of the repetitive waveform in which it occurs.

15. A system for performing vector spectral measurements of a wideband radio frequency (RF) signal, the system comprising:
 a receiver having a frequency span less than a total bandwidth of an output RF signal, provided by a device under test (DUT) in response to a stimulus RF signal, each of the stimulus RF signal and the output RF signal having a repetitive waveform, the receiver being configured to capture a plurality of frequency segments of the output RF signal, externally triggered by marker signals occurring in at least one waveform repetition of the repetitive waveform, respectively, wherein each frequency segment has a corresponding segment bandwidth less than the total bandwidth of the output RF signal; and
 a processing unit configured to concatenate the plurality of frequency segments in frequency domain into a combined bandwidth substantially the same as the total bandwidth of the output RF signal in response to the external triggering for preserving phase continuity among the plurality of frequency segments.

16. The system of claim 15, wherein the concatenated plurality of frequency segments has no phase discontinuities at frequency stitch points.

17. The system of claim 15, wherein the receiver captures the plurality of frequency segments of the output RF signal in frequency domain.

18. The system of claim 17, wherein the processing unit is further configured to inverse transform the concatenated plurality of frequency segments into time domain and create time records, and to play back the time records for displaying a total frequency spectrum of the output RF signal in the time domain.

19. A method of performing vector spectral measurements of a pulsed radio frequency (RF) signal having a repetitive waveform, using a receiver having a frequency span less than a total bandwidth of the pulsed RF signal, the method comprising:
 capturing a plurality of frequency segments of the pulsed RF signal corresponding to waveforms of the repetitive waveform synchronized to corresponding external triggering, each frequency segment having a corresponding segment bandwidth less than the total bandwidth of the RF signal;

detecting a start time of an RF burst in a period of each repetitive waveform of the pulsed RF signal; and performing at least one instance of phase stitching and at least one instance of amplitude stitching between adjacent captured frequency segments using the external triggering to obtain a stitched signal having the repetitive waveform, wherein the external triggering is responsive to the detected start time of the RF burst in each repetitive waveform.

* * * * *

UNITED STATES PATENT AND TRADEMARK OFFICE
CERTIFICATE OF CORRECTION

| | |
|---|---|
| PATENT NO. | : 9,851,383 B1 |
| APPLICATION NO. | : 14/555141 |
| DATED | : December 26, 2017 |
| INVENTOR(S) | : Edward M. Barich |

Page 1 of 1

It is certified that error appears in the above-identified patent and that said Letters Patent is hereby corrected as shown below:

In Column 12, Line 2, in Claim 9, delete "FQ" and insert -- I/Q --, therefor.

Signed and Sealed this
Thirteenth Day of March, 2018

Andrei Iancu
*Director of the United States Patent and Trademark Office*